United States Patent
Gillig et al.

(10) Patent No.: US 6,185,411 B1
(45) Date of Patent: *Feb. 6, 2001

(54) APPARATUS AND METHOD FOR ENABLING ELEMENTS OF A PHASE LOCKED LOOP

(75) Inventors: Steven Frederick Gillig, Roselle; Jeannie Han Kosiec, Schaumburg, both of IL (US)

(73) Assignee: Motorola Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/939,157

(22) Filed: Aug. 29, 1997

Related U.S. Application Data

(63) Continuation of application No. 08/394,045, filed on Feb. 24, 1995, now abandoned, which is a continuation of application No. 08/149,676, filed on Nov. 9, 1993, now abandoned.

(51) Int. Cl.[7] ......................................................... H04B 1/06
(52) U.S. Cl. ............................ 455/260; 455/76; 455/343; 331/14
(58) Field of Search ............................... 455/38.3, 180.3, 455/183.2, 260, 264, 265, 76, 343; 331/10, 14, 17, 19, 25, 9; 375/376

(56) References Cited

U.S. PATENT DOCUMENTS

| | | | |
|---|---|---|---|
| 4,479,261 | * 10/1984 | Oda et al. | 455/343 |
| 4,518,961 | 5/1985 | Davis et al. | 455/825.44 |
| 4,521,918 | * 6/1985 | Challen | 455/343 |
| 4,673,892 | * 6/1987 | Miyashita et al. | 455/343 |
| 4,743,864 | * 5/1988 | Nakagawa et al. | 455/343 |
| 4,777,655 | * 10/1988 | Numata et al. | 455/260 |
| 4,817,199 | * 3/1989 | Wallraff | 455/260 |
| 4,827,225 | * 5/1989 | Lee | 331/10 |
| 4,893,094 | * 1/1990 | Herold et al. | 455/343 |
| 5,140,698 | 8/1992 | Toko | 455/76 |
| 5,180,992 | 1/1993 | Akiyama et al. | 331/11 |
| 5,202,906 | 4/1993 | Saito et al. | 331/14 |
| 5,220,294 | * 6/1993 | Ichikawa | 331/17 |
| 5,257,294 | * 10/1993 | Pinto et al. | 331/1 A |
| 5,278,521 | * 1/1994 | Sato | 331/14 |
| 5,392,457 | 2/1995 | Davis et al. | 455/38.3 |

* cited by examiner

Primary Examiner—Edward F. Urban
(74) Attorney, Agent, or Firm—Kevin D. Kaschke; Sylvia Chen

(57) ABSTRACT

An apparatus and method enables elements of a phase locked loop (PLL) (300). The PLL 300 includes a plurality of elements (202, 203, 204, 205). Each element produces an output signal (207, 208, 209, 116 or 117). Each element has a response time (t3–t2) defined by the difference in time between a first time (t2) at which the element is enabled and a second time (t3), occurring after the first time (t2), at which the output signal of the element reaches a steady state condition. A voltage controlled oscillator (204) of the plurality of elements, having a first response time (t3–t2) is enabled at the first time (t2) responsive to a first control signal (302). A loop divider (205) of the plurality of elements, having a second response time less than the first response time (t3–t2), is enabled responsive to the first response time (t3–t2) and a second control signal (303). The present invention advantageously provides fast lock time for the PLL (300).

19 Claims, 4 Drawing Sheets

100

−PRIOR ART−

−PRIOR ART−

300

US 6,185,411 B1

APPARATUS AND METHOD FOR ENABLING ELEMENTS OF A PHASE LOCKED LOOP

This is a continuation of application Ser. No. 08/394,045, filed Feb. 24, 1995 and now abandoned, which is a continuation of application Ser. No. 08/149,676, filed Nov. 9, 1993, now abandoned.

FIELD OF THE INVENTION

The present invention relates generally to radio communication transceivers and, more particularly, to an apparatus and method for enabling a phase locked loop in a radio communication transceiver.

BACKGROUND OF THE INVENTION

FIG. 1 illustrates, by example, a block diagram of a conventional radio communication transceiver 100 (hereinafter referred to as "transceiver"). The transceiver 100 enables a mobile or portable subscriber unit to communicate with a base station (not shown), for example, over radio frequency (RF) channels in a radio communication system (not shown). The base station thereafter provides communications with a landline telephone system (not shown) and other subscriber units. An example of a subscriber unit having the transceiver 100 is a cellular radiotelephone.

The transceiver 100 of FIG. 1 generally includes an antenna 101, a duplex filter 102, a receiver 103, a transmitter 105, a reference frequency signal source 107, a receive (Rx) phase locked loop (PLL) frequency synthesizer 108, a transmit (Tx) PLL frequency synthesizer 109, a processor 110, an information source 106, and an information sink 104.

The interconnection of the blocks of the transceiver 100 and operation thereof is described as follows. The antenna 101 receives a RF signal 119 from the base station for filtering by the duplex filter 102 to produce an RF received signal at line 111. The duplex filter 102 provides frequency selectivity to separate the RF received signal at line 111 and the RF transmit signal at line 113. The receiver 103 is coupled to receive the RF received signal at line 111 and operative to produce a received baseband signal at line 112 for the information sink 104. The reference frequency signal source 107 provides a reference frequency signal at line 115. The Rx PLL frequency synthesizer 108 is coupled to receive the reference frequency signal at line 115 and information on a data bus 118 and operative to produce a receiver tune signal at line 116 to tune the receiver 103 to a particular RF channel. Likewise, the Tx PLL frequency synthesizer 109 is coupled to receive the reference frequency signal at line 115 and information on the data bus 118 and operative to produce a transceiver tune signal at line 117 to tune the transmitter 105 to a particular RF channel. The processor 110 controls the operation of the Rx PLL frequency synthesizer 108, the Tx PLL frequency synthesizer 109, the receiver 103, and the transmitter 105 via the data bus 118. The information source 106 produces a baseband transmit signal at line 114. The transmitter 105 is coupled to receive the baseband transmit signal at line 114 and operative to produce the RF transmit signal at line 113. The duplex filter 102 filters the RF transmit signal at line 113 for radiation by the antenna 101 as a RF signal 120.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the landline telephone system. In cellular radiotelephone systems capable of transceiving wide band data on the signaling channels, the frequency spacing of the signaling channels is a multiple of the frequency spacing of the voice channels.

In some cellular radiotelephone systems, the transceiver 100 and the base station intermittently transceive information therebetween on the signaling channel. One such system, for example, an interleaved data signaling method to synchronize the intermittent information. In this type of system, keeping the transceiver 100 fully powered during the entire time that the transceiver 100 is tuned to the signaling channel unnecessarily drains the transceiver's battery during those times when the information is not received. Therefore, portions of the transceiver 100 can be powered off to prolong battery life when the transceiver is not transceiving information. Further, portions of the transceiver 100 can be powered off to prolong battery life when the signal quality is good enough such that further repetition of the same information is not needed. Intermittently powering on and off, i.e. enabling and disabling, the transceiver 100 during its receive operation is called discontinuous receive (DRX) mode of operation. In the DRX mode of operation, quickly enabling and disabling the portions of transceiver 100 increases the savings in battery life.

FIG. 2 illustrates, by example, a block diagram of a conventional phase locked loop (PLL) frequency synthesizer for use in the transceiver 100 of FIG. 1. The general structure of the PLL frequency synthesizer of FIG. 2 is the same for both the Rx PLL frequency synthesizer 108 and the Tx PLL frequency synthesizer 109.

The PLL frequency synthesizer 108 or 109 of FIG. 2 generally includes a reference divider 201, for discussion purposes, and a PLL 212. The PLL 212 generally includes a phase detector 202, a loop filter 203, a voltage controlled oscillator 204, and a loop divider 205. The reference divider 201 receives a reference frequency signal on line 115.

The interconnection of the blocks of the PLL frequency synthesizer 108 or 109 of FIG. 2 is described as follows. The reference divider 201 is coupled to receive the reference signal at line 115 and the data bus 118 and operative to produce a divided reference frequency signal at line 206. The phase detector 202 is coupled to receive a divided reference frequency signal at line 206 and a feedback signal at line 209, and operative to produce a phase error signal at line 207. The loop filter 203 is coupled to receive the phase error signal 207, and operative to produce a filtered signal at line 208. The voltage controlled oscillator 204 is coupled to receive the filtered signal at line 208 and operative to produce an output frequency signal at line 116 or 117. The loop divider 205 is coupled to receive the output frequency signal at line 116 or 117, and operative to produce the feedback signal at line 209. The loop divider 205 and the reference divider 201 are coupled to receive programming information at the data bus 118.

The operation of the PLL frequency synthesizer 108 or 109 of FIG. 2 is described as follows. The PLL 212 is a circuit which produces the output frequency signal at line 116 or 117 synchronized to the reference frequency signal at line 115. The output frequency signal at line 116 or 117 is synchronized or "locked" to the reference frequency signal at line 115 when the frequency of the output frequency signal at line 116 or 117 has a predetermined frequency relationship to the frequency of the reference frequency signal at line 115. Under locked conditions, the 212 PLL typically provides a constant phase difference between the reference frequency signal at line 115 and the output frequency signal at line 116 or 117. The constant phase difference may assume any desired value including zero. Should a deviation in the desired phase difference of such signals develop, i.e., should a phase error at line 207 develop due to, e.g., variation in either the frequency of the reference frequency signal at line 115 or programmable parameters of the PLL via the data bus 118, the PLL adjusts the frequency of the output frequency signal at line 116 or 117 to drive the phase error at line 207 toward the value of the constant phase difference.

A problem exists when a PLL frequency synthesizer is re-enabled after a period of being disabled, such as occurs in the DRX mode. Assume, ideally, that the voltage on the frequency control line to the VCO remained a constant value throughout a disable/re-enable sequence. Even so, the frequency of the VCO when it is re-enabled may temporarily be different from the frequency it was just before it was disabled. This temporary difference lasts as long as is required for the VCO and its bias circuitry to stabilize. The VCO is typically very sensitive to power supply noise and spurious signals and therefore often employs a superfilter or considerable capacitive filtering in its power supply connection. A significant amount of time may be needed for the VCO bias condition to settle to its steady state value. During this time the PLL will detect the phase and frequency error and drive the control line to correct the error. This correction will cause the VCO to overshoot its pre-disabled frequency even after the VCO bias condition reaches steady state. The resulting overshoot takes time to settle and more time is needed for the loop to lock than if the erroneous correction had been avoided.

One solution provided by the prior art is to minimize relock time in the DRX mode by keeping the VCO portion of the PLL enabled continuously while disabling the remainder of the PLL. However, a disadvantage of this solution is that the VCO draws a significant portion of the PLL current drain and the current savings in the DRX mode is diminished.

Another solution provided by the prior art is to operate the VCO discontinuously. However, a disadvantage of this solution is that the finite turn-on time of the VCO superfilter and/or bias current is ignored in the turn-on recovery scheme of the PLL. Furthermore, this solution causes power supply noise and spurious signals to be coupled to the output of the PLL.

Accordingly, there is a need for an apparatus and method for enabling a phase locked loop which results in a fast lock time for the phase locked loop.

DETAILED DESCRIPTION OF A PREFERRED EMBODIMENT

In accordance with the present invention, the foregoing need is substantially met by an apparatus and method for enabling elements of a phase locked loop (PLL). According to the present invention, the PLL includes a plurality of elements. Each element is capable of being enabled and disabled responsive to a control signal. Each element produces an output signal. Each element has a response time defined by the difference in time between a first time at which the element is enabled and a second time, occurring after the first time, at which the output signal of the element reaches a steady state condition. A first element of the plurality of elements, having a first response time is enabled at the first time responsive to a first control signal. A second element of the plurality of elements, having a second response time less than the first response time, is enabled responsive to the first response time and a second control signal. The present invention advantageously provides fast lock time for the PLL.

Figure 1:
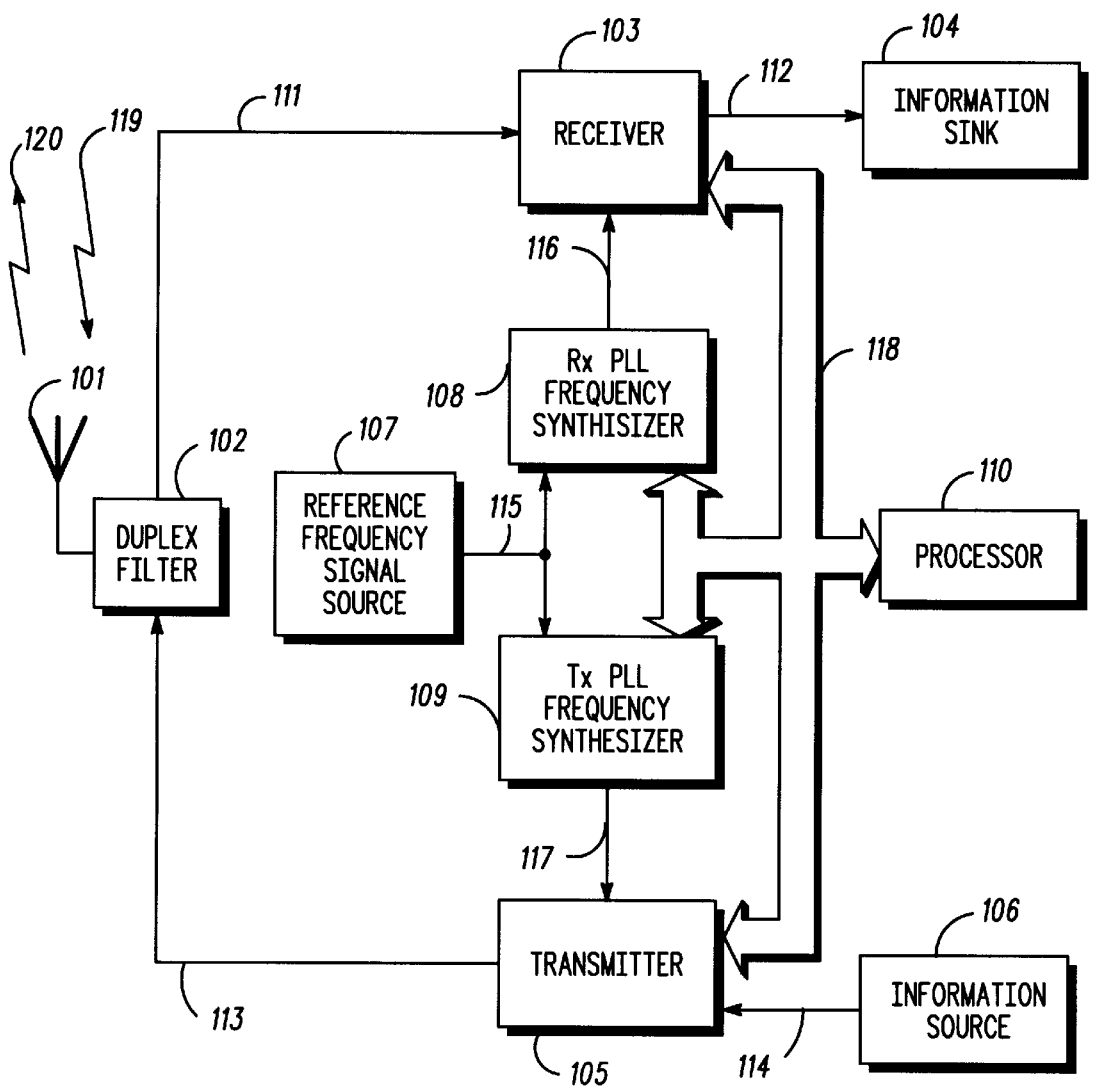
FIG. 1 illustrates a block diagram of a conventional radio communication transceiver.
Figure 2:
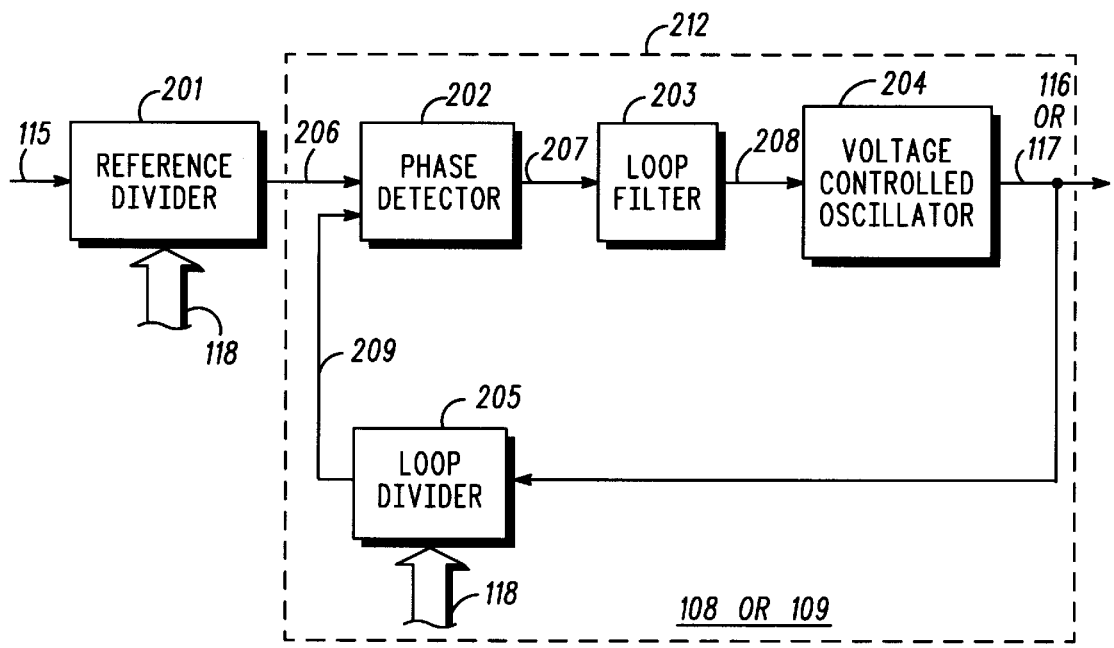
FIG. 2 illustrates a block diagram of a conventional phase locked loop frequency synthesizer for use in the radio communication transceiver of FIG. 1.
Figure 3:
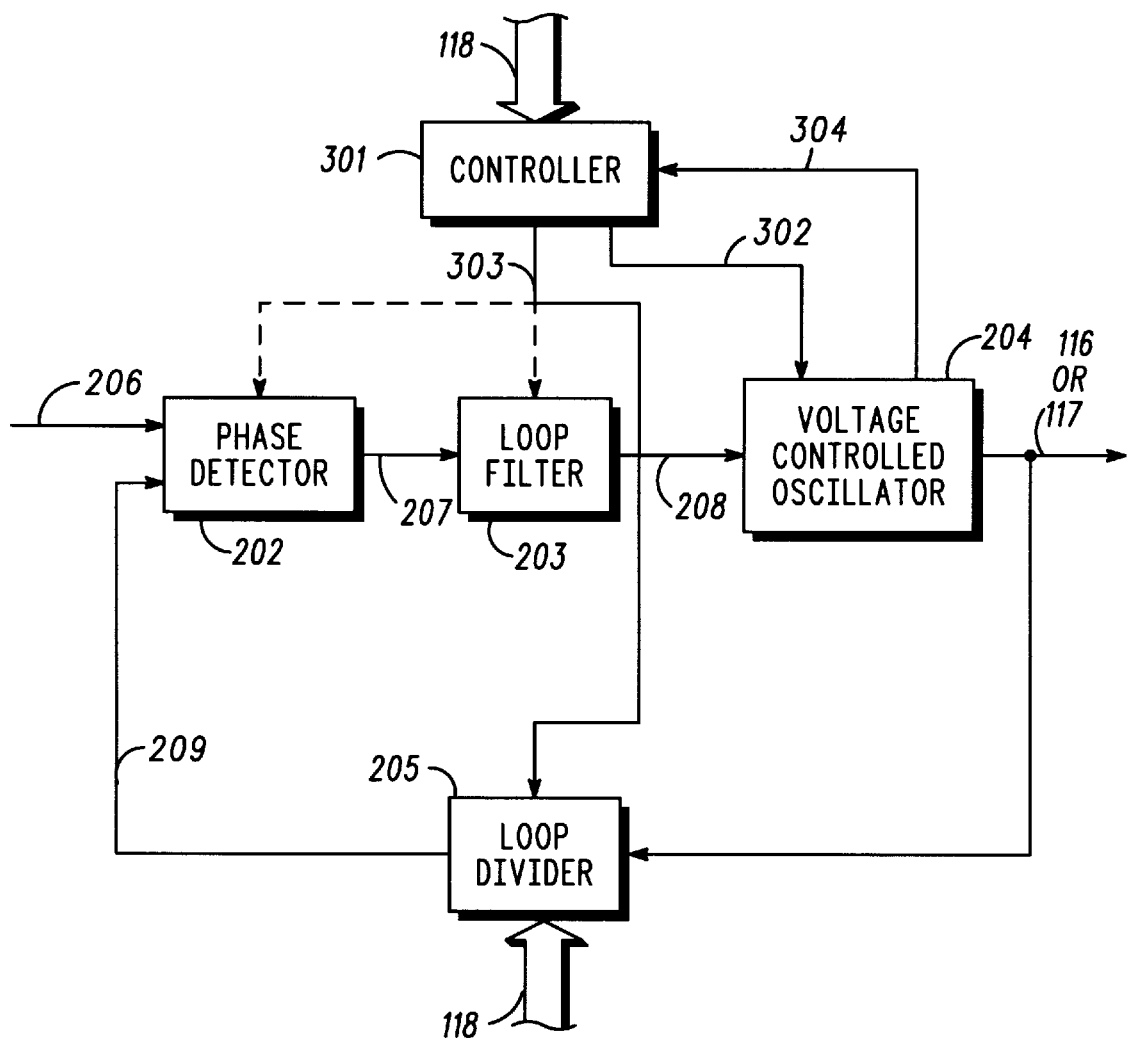
FIG. 3 illustrates a block diagram of a phase locked loop for use in the radio communication transceiver of FIG. 1 in accordance with the present invention.

The present invention can be more fully described with reference to FIGS. 3–5, wherein FIG. 3 illustrates a block diagram of a phase locked loop for use in the radio communication transceiver of FIG. 1 in accordance with the present invention. The general structure and operation of the PLL 300 is similar to the conventional PLL 212 of FIG. 2, except for the addition of a controller 301. The controller 301 is coupled to receive a PLL state control signal on the data bus 118 and operative to produce a first control signal at line 302 and a second control signal at line 303. The controller 301 enables a first element of the plurality of elements, having a first response time, at the first time responsive to the first control signal at line 302, and enables a second element of the plurality of elements, having a second response time less than the first response time, responsive to the first response time and the second control signal.

According to a preferred embodiment of the present invention, the first element of the plurality of elements is a voltage controlled oscillator.

According to the preferred embodiment of the present invention, the second element of the plurality of elements is a loop divider. Alternatively the second element of the plurality of elements may be the phase detector 205 or the loop filter 203.

According to the preferred embodiment of the present invention the first response time is fixed. Alternatively, the first response time may also be variable. The controller 301 is coupled to receive an indication of the first response time at line 304 and operative to control the second control signal at line 303 responsive to the indication of the first response time.

Figure 4:
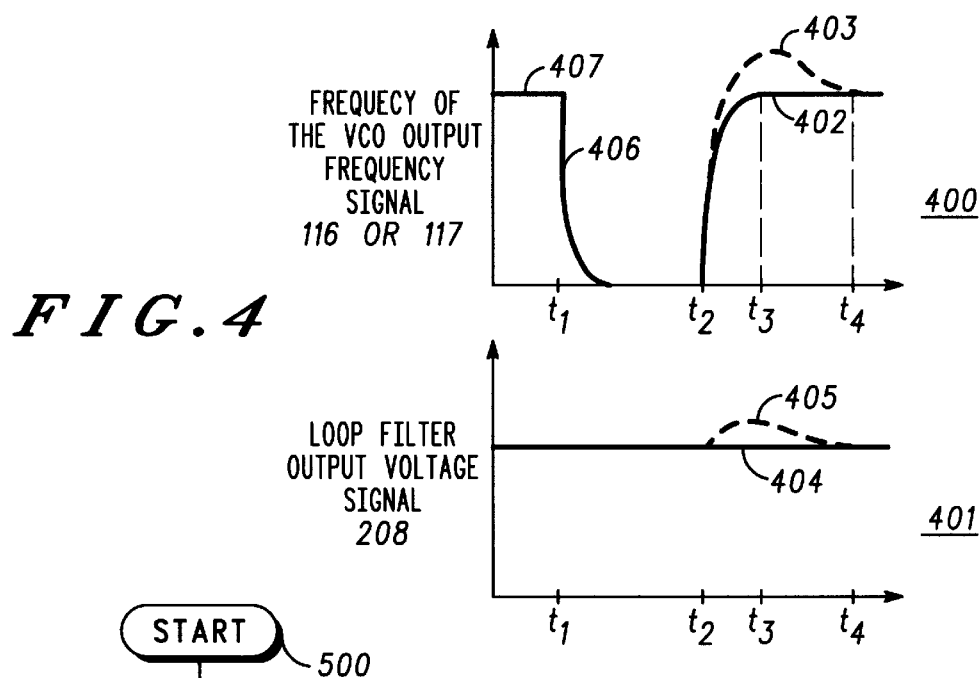
FIG. 4 illustrates a first graph representing an output frequency signal versus time, and a second graph representing an output voltage signal versus time, each signal represented in the phase locked loop of FIG. 3 in accordance with the present invention.

FIG. 4 illustrates a first graph 400 representing an output frequency signal 116 or 117 versus time, and a second graph 401 representing a loop filter output voltage signal 208 versus time. The curves 403 and 405 represent the response of the prior art when PLL 212 is enabled. The curves 402 and 404 represent the response of PLL 300 when it is enabled with control signals 302 and 303 in accordance with the present invention. Graph 400 illustrates the output frequency signal 116 or 117 of the VCO 204 versus time. The second graph 401 represents the output voltage signal at line 208 of the loop filter 203 versus time. The time axis includes times t1–t4 which correspond between the first graph 400 and the second graph 401.

At time t1, PLL 212 and PLL 300 are both disabled. The output frequency signal 116 or 117 follows curve 406 and the frequency of the VCO output frequency signal 116 or 117 decreases as time increases until the frequency reaches zero between t1 and t2. Curve 406 is identical for PLL 212 and PLL 300 because the VCO 204 is disabled in both PLL's at time t1. Between time t1 and t2, the loop filter output voltage 208 is being held constant by the capacitance of the loop filter 203 as indicated by the curve 404 between time t1 and t2.

The curves 402 and 403, both beginning at time t2 are produced as follows. To produce curve 403, the PLL frequency synthesizer 300 is enabled, at time t2, according to the prior art. Prior art has the loop divider 205, the VCO 204, the loop filter 203 and the phase detector 202 enabled at the same time. The phase detector 202 would detect nearly instantaneously at time t2 that the frequency of the output frequency signal 204 is lower than the frequency corresponding to curve 407. A phase error signal 207, shown as curve 405 in second graph 401, would be produced to try to correct the frequency of the output frequency signal 204. The result would be that the frequency of the output frequency signal 204 would follow curve 403, which overshoots the frequency shown be curve 407. The overshoot exists because the corrective action of the PLL overcompensates for the slow response time of the output frequency signal 204. The frequency of the output frequency signal 204 using the prior art method follows curve 403 and does not settle to its final value until time t4.

The novel PLL 300 enables only the VCO 204 at time t2 with control signal 302. Control signal 303 keeps the other elements of the PLL 300 disabled. In the novel PLL 300, the phase detector 202 does not produce a phase error signal at line 207, as shown by curve 404 in graph 401. The result is that the frequency of the output frequency signal 204 follows curve 402 in graph 400. In the novel PLL 300, curve 402 does not overshoot and reaches its final frequency value at approximately t3, corresponding to the same frequency value as curve 407. In the novel PLL 300, the other elements of the PLL 300 are enabled at t3. The phase detector does not produce a large phase error signal 207 and the frequency of the output frequency signal 204 stabilizes in a very short time after time t3. In contrast, the prior art PLL 212 requires until time t4 to stabilize its output frequency, as shown by curve 403. The locktime of the PLL 300 has been shortened, over the prior art, by the difference in time represented by t4–t3.

Figure 5:
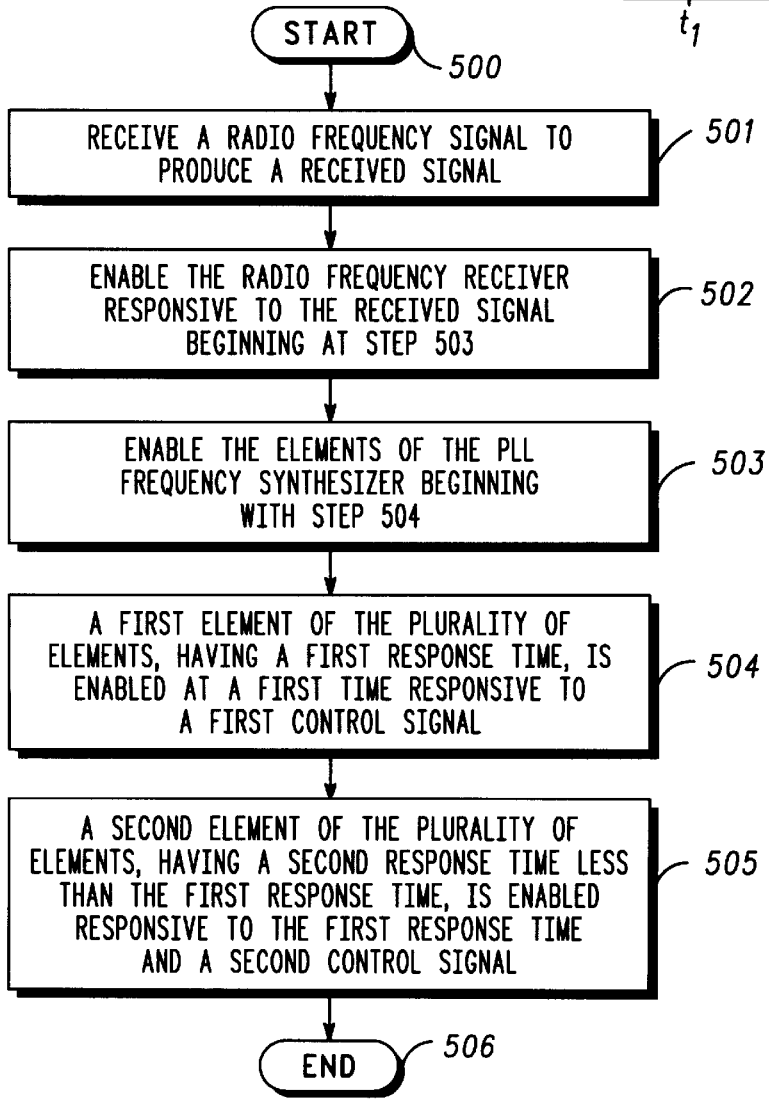
FIG. 5 illustrates a flow chart describing the steps for enabling elements of the phase locked loop of FIG. 3.

FIG. 5 illustrates a flow chart describing the steps for enabling elements of the phase locked loop of FIG. 3. The flowchart begins at step 500. At step 501 a radio frequency signal is received to produce a received signal. At step 502 a radio frequency receiver is enabled responsive to the received signal. The flowchart ends at step 506. The step of enabling the radio frequency receiver 502 includes steps 503–505. At step 503, the elements of the PLL frequency synthesizer is enabled. At step 504, a first element of the plurality of elements, having a first response time, is enabled at a first time responsive to a first control signal. At step 505, a second element of the plurality of elements, having a second response time less than the first response time, is enabled responsive to the first response time and a second control signal.

Step 503, in FIG. 5, enables the elements of the PLL frequency synthesizer in a unique way described by steps 504 and 505. At step 504, the element of the PLL frequency synthesizer with the slowest response time is enabled first. In the preferred embodiment, the VCO has the slowest response time and that is why it is enabled first with the first control signal which corresponds to control signal 302. At step 505, the second element with a response time less than the VCO 204 is enabled. In the preferred embodiment, the second element is the loop divider 205. The control signal 303 enables the loop divider 205 responsive to the first response time, which means that the control signal 303 is delayed until the VCO 204 has substantially reached a steady state frequency before the loop divider 205 is enabled. By enabling the VCO 204 first and waiting to enable the other elements of the PLL 300, the frequency of the output frequency signal 116 or 117 is prevented from overshooting, thereby reducing the locktime of the PLL 300.

In accordance with the present invention, the foregoing need is substantially met by an apparatus and method for enabling a phase locked loop (PLL). According to the present invention, the PLL includes a plurality of elements. Each element is capable of being enabled and disabled responsive to a control signal. Each element produces an output signal. Each element has a response time defined by the difference in time between a first time at which the element is enabled and a second time, occurring after the first time, at which the output signal of the element reaches a steady state condition. A first element of the plurality of elements, having a first response time is enabled at the first time responsive to a first control signal. A second element of the plurality of elements, having a second response time less than the first response time, is enabled responsive to the first response time and a second control signal. The present invention advantageously provides fast lock time for the PLL.

While the present invention has been described with reference to illustrative embodiments thereof, it is not intended that the invention be limited to these specific embodiments. Those skilled in the art will recognize that variations and modifications can be made without departing from the spirit and scope of the invention as set forth in the appended claims.

What is claimed is:

1. In a phase locked loop (PLL) having a plurality of elements including a first element and a second element, each of the first element and the second element having an input terminal and an output terminal, the output terminal of the first element being coupled to the input terminal of the second element and the output terminal of the second element being coupled to the input terminal of the first element to form a feedback signal arrangement in the PLL, each element having a response time defined by a difference in time between a first time at which the element is enabled and a second time, occurring after the first time, at which the output signal of the element reaches a steady state condition, the PLL having a response time defined by a difference in time between a time when a disabled element of the plurality of elements is enabled and a time when an output frequency signal of the PLL reaches a steady state condition, a method for minimizing the response time of the PLL while minimizing power consumption of the PLL comprising the steps of:

enabling the first element, having a first response time, responsive to a first control signal;

monitoring, directly from the first element, an indication of when an output signal of the first element has substantially reached its steady state frequency condition;

controlling a second control signal responsive to the monitored indication; and enabling the second element, having a second response time less than the first response time, responsive to the second control signal.

2. A method according to claim 1 wherein the first element is a voltage controlled oscillator.

3. A method according to claim 1 wherein the second element is a loop divider.

4. A method according to claim 1 wherein the second element is a phase detector.

5. A method according to claim 1 wherein the second element is a loop filter.

6. A method according to claim 1 wherein the first response time is fixed.

7. A method according to claim 1 wherein the first response time is variable.

8. In a phase locked loop (PLL) including a plurality of elements including at least a phase detector, a loop filter, a voltage controlled oscillator, and a loop divider serially coupled to each other to form a feedback signal arrangement in the PLL, each element having a response time defined by a difference in time between a first time at which the element is enabled and a second time, occurring after the first time, at which an output signal of the element reaches a steady state condition, the PLL having a response time defined by a difference in time between a time when a disabled element of the plurality of elements is enabled and a time when an output frequency signal of the PLL reaches a steady state condition, a method for minimizing the response time of the PLL while minimizing power consumption of the PLL comprising the steps of:

enabling the voltage controlled oscillator, having a first response time responsive to a first control signal;

monitoring, directly from the first element, an indication of when an output signal of the voltage controlled oscillator has substantially reached its steady state frequency condition;

controlling a second control signal responsive to the monitored indication; and enabling at least one of the phase detector, the loop filter, and the loop divider, each having a response time less than the first response time, responsive to the second control signal.

9. A method according to claim 8 wherein the first response time is fixed.

10. A method according to claim 8 wherein the first response time is variable.

11. In a phase locked loop (PLL) having an enabled and a disabled state responsive to a PLL state control signal, the PLL having a plurality of elements including a first element and a second element, each of the first element and the second element having an input terminal and an output terminal, the output terminal of the first element being coupled to the input terminal of the second element and the output terminal of the second element being coupled to the input terminal of the first element to form a feedback signal arrangement in the PLL, each element having a response time defined by a difference in time between a first time at which the element is enabled and a second time, occurring after the first time, at which an output signal of the element reaches a steady state condition, the PLL having a response time defined by a difference in time between a time when a disabled element of the plurality of elements is enabled and a time when an output frequency signal of the PLL reaches a steady state condition, an apparatus for minimizing the response time of the PLL while minimizing power consumption of the PLL comprising:

a controller coupled to receive the PLL state control signal and operative to produce a first control signal and a second control signal, wherein the controller enables the first element, having a first response time, responsive to the first control signal, monitors an indication, directly from the first element, of when an output signal of the first element has substantially reached its steady state frequency condition, controls a second control signal responsive to the monitored indication, and enables the second element, having a second response time less than the first response time, responsive to the second control signal.

12. An apparatus according to claim 11 wherein the first element is a voltage controlled oscillator.

13. An apparatus according to claim 11 wherein the second element is a loop divider.

14. An apparatus according to claim 11 wherein the second element is a phase detector.

15. An apparatus according to claim 11 wherein the second element is a loop filter.

16. An apparatus according to claim 11 wherein the first response time is fixed.

17. An apparatus according to claim 11 wherein the first response time is variable.

18. In a radio frequency receiver including a phase locked loop (PLL) frequency synthesizer operative to tune the radio frequency receiver to a radio frequency channel, the PLL frequency synthesizer having a plurality of elements including a first element and a second element, each of the first element and the second element having an input terminal and an output terminal, the output terminal of the first element being coupled to the input terminal of the second element and the output terminal of the second element being coupled to the input terminal of the first element to form a feedback signal arrangement in the PLL, each element having a response time defined by a difference in time between a first time at which the element is enabled and a second time, occurring after the first time, at which an output signal of the element reaches a steady state condition, the PLL having a response time defined by a difference in time between a time when a disabled element of the plurality of elements is enabled and a time when an output frequency signal of the PLL reaches a steady state condition, a method for minimizing the response time of the PLL while minimizing power consumption of the PLL comprising the steps of:

receiving a radio frequency signal to produce a received signal; and enabling the radio frequency receiver responsive to the received signal, wherein the step of enabling the radio frequency receiver further comprises the step of:

enabling the PLL frequency synthesizer comprising the steps of:

enabling the first element, having a first response time, responsive to a first control signal;

monitoring, directly from the first element, an indication of when an output signal of the first element has substantially reached its steady state frequency condition;

controlling a second control signal responsive to the monitored indication; and enabling the second element, having a second response time less than the first response time, responsive to the second control signal.

19. A radio frequency receiver including a phase locked loop (PLL) frequency synthesizer operative to tune the radio frequency receiver to a radio frequency channel, the PLL frequency synthesizer having a plurality of elements including a first element and a second element, each of the first element and the second element having an input terminal and an output terminal, the output terminal of the first element being coupled to the input terminal of the second element and the output terminal of the second element being coupled to the input terminal of the first element to form a feedback signal arrangement in the PLL, each element having a response time defined by a difference in time between a first time at which the element is enabled and a second time, occurring after the first time, at which an output signal of the element reaches a steady state condition, the PLL having a response time defined by a difference in time between a time when a disabled element of the plurality of elements is enabled and a time when an output frequency signal of the PLL reaches a steady state condition, the radio frequency receiver comprising:

a receiver line-up coupled to receive a radio frequency signal and operative to produce a received signal;

a processor coupled to receive the received signal and operative to produce a PLL state control signal responsive to the received signal; and a controller coupled to receive the PLL state control signal and operative to produce a first control signal and a second control signal, wherein the controller enables the first element, having a first response time, responsive to the first control signal, monitors an indication, directly from the first element, of when an output signal of the first element has substantially reached its steady state frequency condition, controls the second control signal responsive to the monitored indication, and enables the second element, having a second response time less than the first response time, responsive to the second control signal.

\* \* \* \* \*